US006649977B1

(12) United States Patent
McCarthy

(10) Patent No.: US 6,649,977 B1
(45) Date of Patent: *Nov. 18, 2003

(54) SILICON ON INSULATOR SELF-ALIGNED TRANSISTORS

(75) Inventor: Anthony M. McCarthy, Menlo Park, CA (US)

(73) Assignee: The Regents of the University of California, Oakland, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 169 days.

(21) Appl. No.: 08/526,339

(22) Filed: Sep. 11, 1995

(51) Int. Cl.[7] .............................................. H01L 27/01
(52) U.S. Cl. ......................................... 257/347; 257/67
(58) Field of Search ............................. 257/57, 66, 67, 257/347

(56) References Cited

U.S. PATENT DOCUMENTS

| | | | |
|---|---|---|---|
| 3,647,581 A | | 3/1972 | Mash .......................... 148/175 |
| 5,086,011 A | | 2/1992 | Shiota .......................... 437/61 |
| 5,206,749 A | * | 4/1993 | Zavracky et al. ............. 359/59 |
| 5,275,851 A | * | 1/1994 | Fonash et al. ............... 427/578 |
| 5,343,064 A | * | 8/1994 | Spangler et al. ............ 257/350 |
| 5,414,276 A | * | 5/1995 | McCarthy ..................... 257/57 |
| 5,434,441 A | * | 7/1995 | Inoue et al. ................. 257/347 |

OTHER PUBLICATIONS

E. D. Palik, et al., Ellipsometric Study of the Etch–Stop Mechanism in Heavily Doped Silicon, *Journal of Electrochemical Society*, vol. 132, No. 1, Jan. 1985, pp. 135–141.
B. Kloeck, et al., Study of Electrochemical Etch–Stop for High–Precision Thickness Control of Silicon Membranes, *IEEE Trans. on Electron Devices*, vol. 36, No. 4, Apr. 1989, pp. 663–669.
R. Huster, et al., Vertically Structured Silicon Membranes by Electrochemical Etching, *Sensors and Actuators*, A21–A23 (1990), pp. 899–903.
R. Voss, et al., Light–Controlled, Electrochemical, Anisotropic Etching of Silicon, IEEE, 1991, pp. 140–143.

* cited by examiner

*Primary Examiner*—Douglas A. Wille
(74) *Attorney, Agent, or Firm*—Eddie E. Scott; L. E. Carnahan; Alan H. Thompson

(57) ABSTRACT

A method for fabricating thin-film single-crystal silicon-on-insulator (SOI) self-aligned transistors. Standard processing of silicon substrates is used to fabricate the transistors. Physical spaces, between the source and gate, and the drain and gate, introduced by etching the polysilicon gate material, are used to provide connecting implants (bridges) which allow the transistor to perform normally. After completion of the silicon substrate processing, the silicon wafer is bonded to an insulator (glass) substrate, and the silicon substrate is removed leaving the transistors on the insulator (glass) substrate. Transistors fabricated by this method may be utilized, for example, in flat panel displays, etc.

21 Claims, 3 Drawing Sheets

SILICON ON INSULATOR SELF-ALIGNED TRANSISTORS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to fabricating crystalline silicon microelectronic components, particularly to the fabrication of such components on an insulator (glass) substrate, and more particularly to a self-aligned transistors and a method for fabricating such self-aligned transistors on glass substrates.

Silicon-on-insulator (SOI) technologies have advanced dramatically in recent years towards the goal of producing thin crystalline silicon films on insulator substrates. Components, such as metal-oxide-semiconductors (MOS) transistors, fabricated in SOI films have the potential for increased mobility, reduced parasitic capacitance and leakage current, as well as improved radiation hardness due to reduced junction sidewall area and elimination of bottom junction area. Until recently, there had been no success in achieving crystalline silicon device fabrication on less expensive, low-temperature glass capable of withstanding processing temperature of no more than about 600° C., although such fabrication techniques have been previously achieved using polysilicon on expensive, high temperature glass. SOI transistors on glass substrates are particularly attractive for sensors and flat-panel displays, although many other applications are possible, such as actuators, high temperature electronics, optoelectronics, and radiation hard electronics.

Recently, methods have been developed for achieving single-crystal silicon device fabrication on less expensive glass substrates, wherein the microelectronic components are formed on a silicon substrate, then transferred to a glass substrate, and the silicon substrate is thereafter removed. These recent silicon-on-glass methods are described and claimed in copending U.S. application Ser. No. 08/137,401, filed Oct. 18, 1993, now U.S. Pat. No. 5,395,481 issued Mar. 7, 1998, entitled "A Method For Forming Silicon On A Glass Substrate"; U.S. application Ser. No. 08/137,412, filed Oct. 18, 1993, now U.S. Pat. No. 5,488,012, issued Jan. 30, 1996, entitled "Silicon On Insulator With Active Buried Regions"; U.S. application Ser. No. 08/137,411, filed Oct. 18, 1993, now U.S. Pat. No. 5,399,231 issued Mar. 21, 1995, entitled "Crystalline Silicon Devices On Glass"; and U.S. application Ser. No. 08/137,402, filed Oct. 18, 1994, now U.S. Pat. No. 5,414,276 issued May 9, 1995, entitled "Method For Fabricating Transistors Using Crystalline Silicon Devices On Glass", each assigned to the same assignee.

These recent efforts have resulted in a significant advance in SOI technologies, as there are significant advantages to utilizing conventional silicon high temperature processing, particularly where there is a need for the capability to produce microelectronic devices on less expensive, low-temperature glasses. These advantages relate to the immediate ability of silicon microelectronics firms to take advantage of this technology without significant capital investment.

While the methods of the above-referenced copending applications Ser. No. 08/137,411 and Ser. No. 08/137,402 have provided a way to utilize the advantages of high temperature silicon processes combined with inexpensive low-temperature glass, these methods require a flat surface for bonding the components to the glass substrate, which limits the range of transistor implementations to non-self-aligned transistors, a slower but still adequate transistor type for most applications. To achieve truly high performance SOI will require self-aligned transistors. The method of the present invention enables the fabrication of self-aligned transistors, with the combined advantages of the above-referenced silicon-on-glass approaches. This is accomplished by providing physical spaces, between the source and the gate, and between the drain and the gate, introduced by etching the polysilicon gate material and providing implanted bridges in the etched regions which allow the transistor to perform normally.

SUMMARY OF THE INVENTION

It is an object of the present invention to provide single-crystal silicon devices on an insulator substrate.

A further object of the invention is to provide a method for forming microelectronic devices on silicon-on-insulator substrates using conventional processing techniques for forming the microelectronic devices, while having the capability of using inexpensive, low-temperature glass as the substrate.

Another object of the invention is to provide silicon on insulator self-aligned transistors.

Another object of the invention is to provide a method for producing self-aligned transistors formed on a silicon substrate and then transferred to a glass substrate.

Another object of the invention is to provide a method for fabricating self-aligned transistors on inexpensive, low-temperature glass, for example, wherein the implanting of the source and drain is carried out at the same time as implantation of the gate.

Other objects and advantages of the invention will become apparent from the following description and accompanying drawing. Basically, the invention involves silicon-on-insulator self-aligned transistors and a method for fabricating same. The invention involves a method generally similar to those of the above-referenced copending applications Ser. No. 08/137,411 and Ser. No. 08/137,402, but basically differs in the simultaneous formation of the gate, drain, and source, whereby self-aligned transistors are produced. In addition, the method of this invention eliminates the use of etch stop layers used in the fabrication methods of the above-referenced application by utilizing an electrochemical etching process to remove the silicon substrate, such as described and claimed in copending U.S. application Ser. No. 08/484,062, filed Jun. 6, 1995, entitled "Silicon On Insulator Using Electrochemical Etching", and assigned to the same assignee.

DETAILED DESCRIPTION OF THE INVENTION

The present invention is directed to silicon-on-insulator self-aligned transistors and a method for fabricating same wherein the transistor is formed on a silicon substrate using standard processing techniques, implanting the source and drain at the same time as the polysilicon gate, which allows for implant straggle (bridging) under the gate to guarantee electrical contact to the device. Physical spaces between the source and gate, and between the drain and gate, introduced by etching the polysilicon gate material, are used to provide connecting implants which allow the transistor to perform normally. After process completion the silicon wafer frontside is bonded to an insulator (glass), and the silicon substrate is removed leaving the transistor on the glass substrate.

As pointed out above, single-crystal silicon-on-glass devices, particularly applicable for flat-panel displays have been produced using the methodologies of above-referenced copending applications Ser. No. 08/137,411 and Ser. No. 08/137,402. Using the methodologies described and claimed in these copending application to form crystalline silicon transistors on glass has the drawback that if a metal such as aluminum or titanium is used as the gate material it is impossible to perform the drain/source implant and subsequent anneal since this would damage the metal gate. Thus, the transistors of these previous copending applications are non-self-aligned metal gate devices, and to achieve truly high-performance SOI will require self-aligned transistors, which can be produced by the method of the present invention. While the present invention uses a methodology similar to those of the above-referenced applications, it uses polysilicon as the gate material, and utilizes bridge implants under the gate to assure proper electrical contact between the gate/source and gate/drain.

Figure 1:
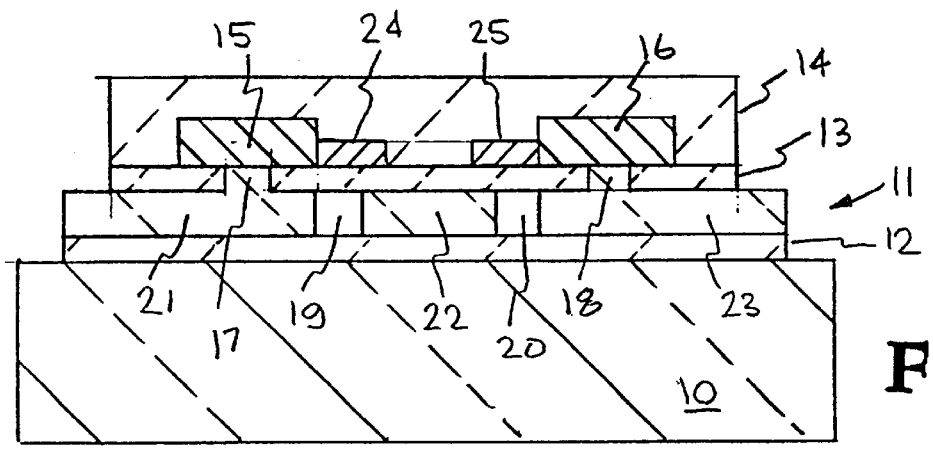
FIG. 1 illustrates an embodiment of a silicon-on-insulator self-aligned transistor made in accordance with the present invention.

An embodiment of a silicon-on-glass self-aligned transistor, as made in accordance with the present invention, is illustrated in FIG. 1. The self-aligned transistor of FIG. 1 comprises a glass substrate 10, a layer of polysilicon, generally indicated at 11, bonded to the glass substrate 10 via a thin dielectric layer 12, and with an oxide layer 13 intermediate the polysilicon layer 11 and a conductivity type 1 silicon layer 14. A source 15 and drain 16 are diffused in silicon layer 14, with oxide layer 13 having holes 17 and 18 filled with polysilicon. The polysilicon layer 11 is provided with spaces or holes 19 and 20 thereby defining a source section 21, a gate section 22, and a drain section 23, with the source and drain sections 21 and 23 being in electrical contact with the diffused source and drain 15–16 via the polysilicon filled holes 17–18 in oxide layer 13. Bridges 24 and 25 are formed in the layer 14 and in electrical contact with source 15 and drain 16, thereby guaranteeing electrical contact with the inversion region under the oxide 13 covered by the gate 22.

The FIG. 1 embodiment of the self-aligned transistor may be fabricated as follows, with reference to FIGS. 2–12 using different reference numerals, than FIG. 1, since the goal is to maintain during processing a flat surface on the silicon substrate prior to bonding to an insulator (glass) substrate.

Figure 2:
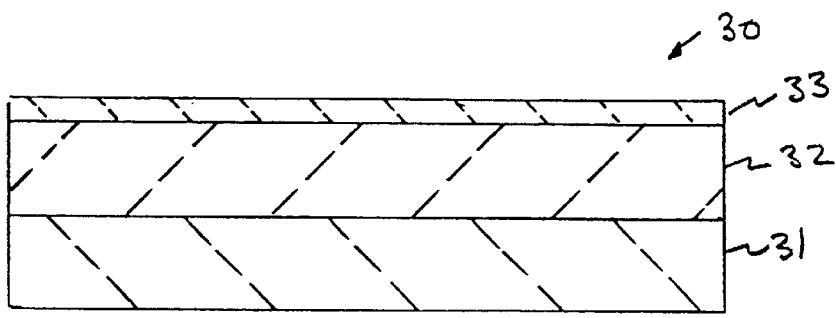
FIGS. 2–12 illustrate a sequence of operation for fabricating the self-aligned transistor of FIG. 1.

1. A silicon substrate or wafer, generally indicated at 30 is composed of a section or layer 31 of conductivity type 2 silicon and a section or layer 32 of conductivity type 1 silicon, as seen in FIG. 2, having a thickness greater than 0.5 microns, and formed by implantation and diffusion or by epitaxy.

2. An oxide layer 33, such as silicon dioxide, having a typical thickness range of 50 Å to 1 micron is formed on the surface of silicon layer 32, as seen in FIG. 2, by for example, thermal oxidation, low temperature oxide chemical vapor deposition, spin-on-glass, plasma enhanced chemical vapor deposition or sputtering.

Figure 3:
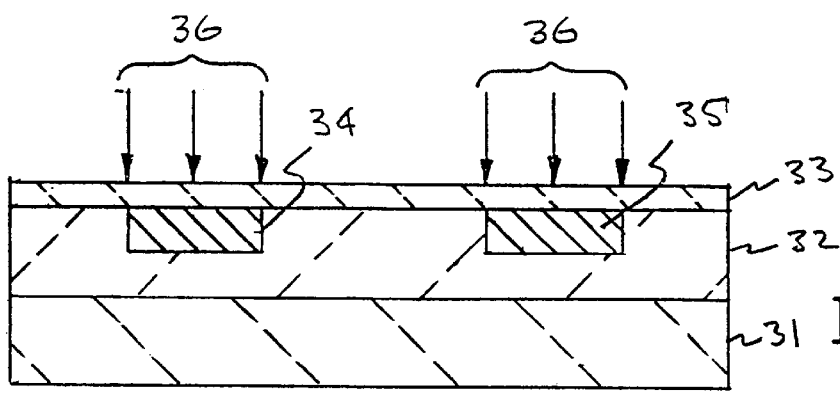

3. A source 34 and drain 35, doped with, for example, boron if region 32 is n-type or, for example, phosphorous or arsenic if region 32 is p-type, junction depth greater than 100 Å are patterned and implanted as indicated by arrows 36 in an outer surface region of silicon layer 32, as seen in FIG. 3.

Figure 4:
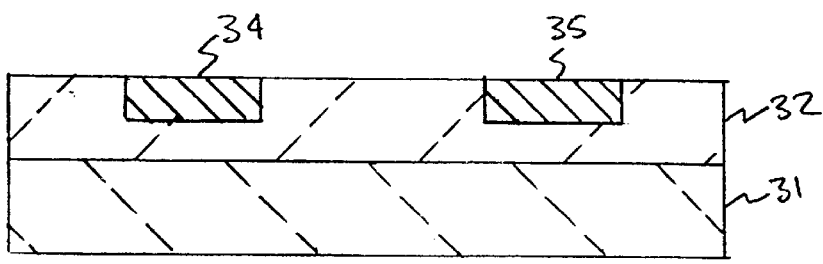

4. The oxide layer 33 is removed, as seen in FIG. 4.

Figure 5:
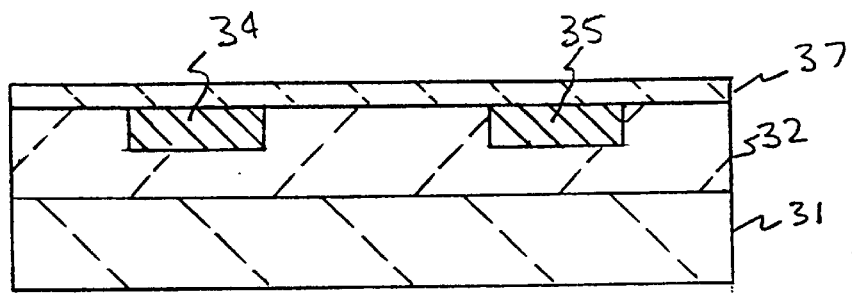

5. A new oxide layer 37, such as silicon dioxide, is thermally grown on silicon layer 32, source 34 and drain 35, as seen in FIG. 5. The oxidation may be performed simultaneously while the implant is annealed and activated at elevated temperatures usually exceeding 600° C.

Figure 6:
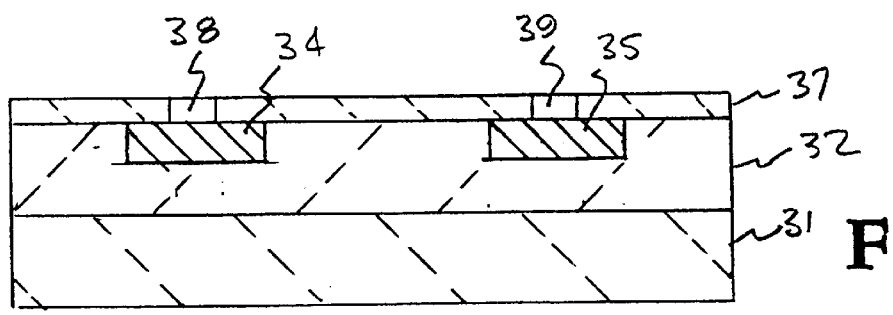

6. Contact holes or openings 38 and 39 are formed in oxide layer 37, as shown in FIG. 6. Photoresist is patterned and exposed and the holes are etched using wet and dry etching. The photoresist is then stripped.

Figure 7:
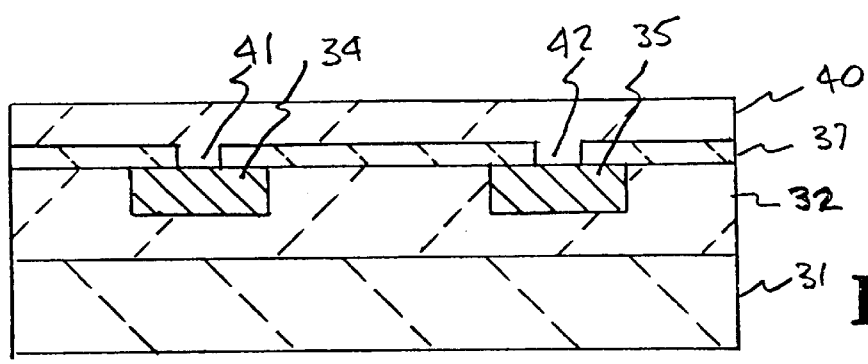

7. A layer of polysilicon 40, having a thickness greater than 500 Å, is deposited on the surface of oxide layer 37 and in holes 38 and 39, to provide contacts 41 and 42 with source 34 and drain 35, as seen in FIG. 7, for example, by low pressure chemical vapor deposition.

Figure 8:
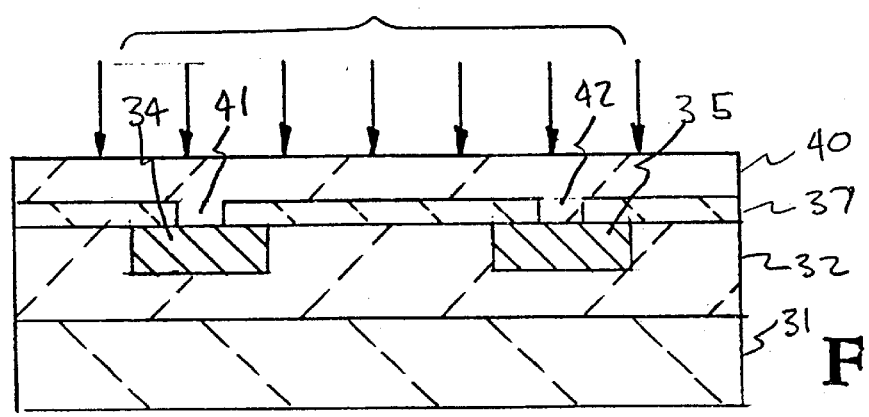

8. The polysilicon forming layer 40 and contacts 41 and 42 are typically doped with boron or phosphorous or arsenic as seen in FIG. 8. The doping may be performed by implantation and annealing or liquid or solid source diffusion at elevated temperatures.

Figure 9:
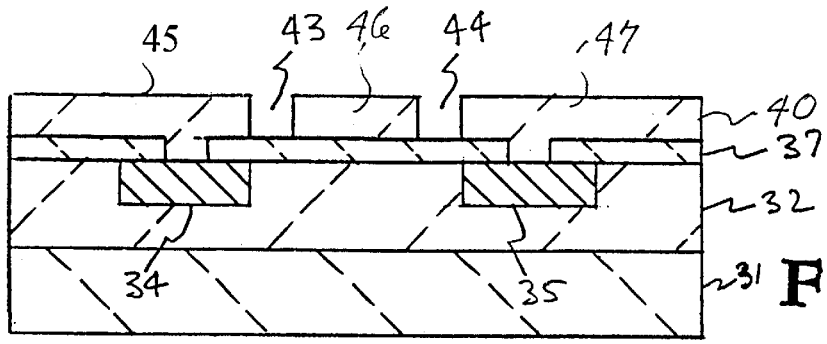

9. The doped polysilicon layer 40 is patterned and etched to form openings, holes, or spaces 43 and 44 therein and forming polysilicon cuts or sections 45, 46 and 47, as seen in FIG. 9 by forming a photoresist layer on the wafer surface, exposing the required pattern and etching the polysilicon, for example, in a plasma etcher.

Figure 10:
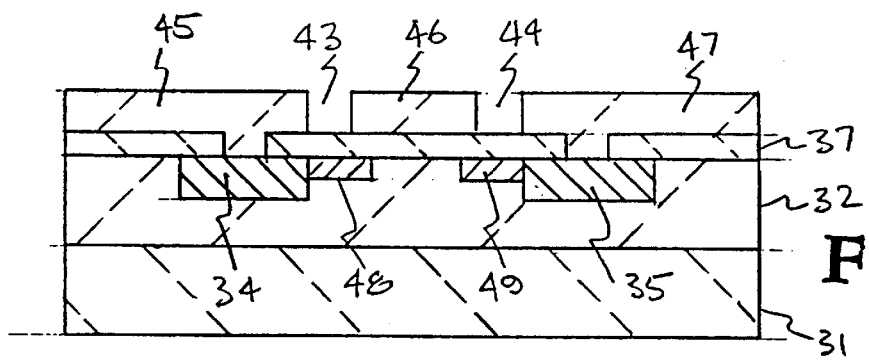

10. A pair of bridge regions 48 and 49, having junction depths greater than 500 Å are implanted (activated) in the surface of silicon layer 32 adjacent source 34 and drain 35, as seen in FIG. 10. The patterning photoresist utilized in the formation of holes or opening 43 and 44 in polysilicon layer 40 may be optionally removed prior to bridge implantation. The bridge regions 48 and 49 may be performed at 0° tilt on the wafer to facilitate penetration between the source-to-gate (45 to 46) and drain-to-gate (47 to 46) polysilicon cuts or sections 45, 46 and 47, and is self-aligned to the gate 46 of polysilicon (see FIG. 10). Each of the activated bridge regions 48 and 49 permits the self-aligned device to function electrically.

Figure 11:
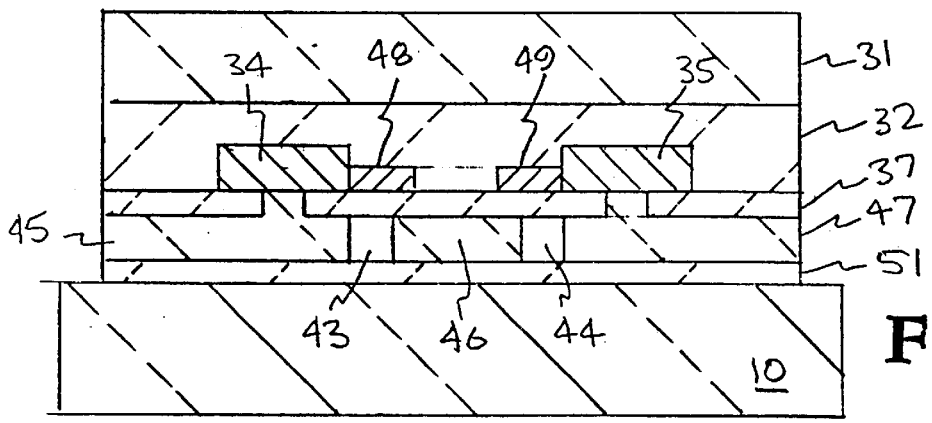

11. The assembly as illustrated in FIG. 10 is then bonded to a glass substrate 10 by bonding the doped silicon layer 40 to the glass substrate via a thin (thickness greater than 100 Å) layer of dielectric material 51, such as silicon dioxide, silicon nitride, or amorphous silicon, as seen in FIG. 11, in a furnace at temperatures greater than about 275° C. using glass with a coefficient of thermal expansion matching silicon (for example, Corning 7740) and with a voltage across the assembly usually exceeding 300V and not exceeding 5000V. The glass substrate 10 may be composed of so-called lowtemperature glass, incapable of withstanding conventional silicon processing temperatures (above about 200° C.), or a substrate of selected insulator (plastic) material may be used in place of the glass substrate 10. In this latter case a suitable adhesive layer such as epoxy or thermalsetting plastic may be used.

Figure 12:
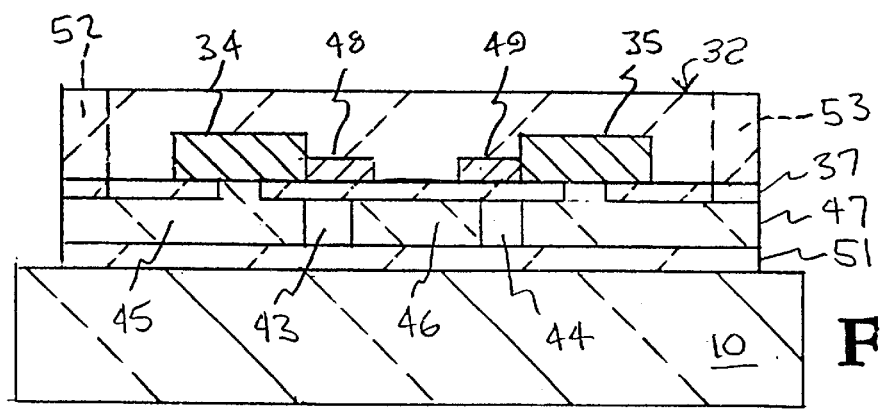

12. The silicon layer 31 of substrate 30 is removed, as shown in FIG. 12, by either grinding, polishing, dry or wet chemistries or a combination thereof.

13. Outer end sections indicated at 52 and 53 of silicon layer 32 and oxide layer 33, see FIG. 12, are then removed to produce the FIG. 1 embodiment of a silicon-on-glass self-aligned transistor. End sections 52 and 53 are removed by first performing a photoresist patterning and etching step to remove the material covering the alignment target regions and a second photoresist patterning and etching step to remove the end sections 52 and 53. Silicon Silicon of conductivity type 2, as utilized in layer 31, is defined herein as an N-type material, exemplified by phosphorous or arsenic. Silicon of conductivity type 1, is utilized in layer 32, is defined herein as an p-type material, exemplified of boron. Also, a layer of dielectric material, such as silicon dioxide, silicon nitride, silicon oxyntride, and amorphous or sputter silicon, as shown at 12 in FIG. 1, may be deposited on silicon layer 32 prior to depositing the oxide layer 33.

It has thus been shown, that the present invention provides a silicon-on-insulator self-aligned transistor and method of fabricating same wherein conventional silicon processing techniques can be used to form the components on a silicon substrate, and whereafter the formed components are transferred to an insulator (glass) substrate and the initial silicon substrate is removed. Thus, this invention provides a method for the fabrication of high-performance, self-aligned SOI transistors, which are particularly applicable for use in flat-panel displays, etc.

While a particular embodiment has been illustrated and described, and a specific operational sequence has been set forth to produce the embodiment, and while specific materials, parameters, etc. have been set forth to illustrate and exemplify the self-aligned transistor and its fabrication, such are not intended to be limiting. Modifications and changes may become apparent to those skilled in the art, and it is intended that the invention be limited only by the scope of the appended claims.

What is claimed is:

1. A silicon on insulator self-aligned transistor, comprising:
    a substrate composed of insulator material;
    a layer of doped polysilicon on a surface of said substrate, said layer of polysilicon having sections defining therein a polysilicon source, a polysilicon gate, and a polysilicon drain;
    a layer of oxide material adjacent and in contact with a surface of said layer of polysilicon, said layer of oxide material having holes therein containing doped polysilicon in contact with said polysilicon source and said polysilicon drain;
    a layer of silicon of conductivity type 1 adjacent and in contact with a surface of said layer of oxide material;
    a diffused source and a diffused drain located in said layer of conductivity type 1 silicon and in contact with said polysilicon source and said polysilicon drain via said doped polysilicon contained in said holes in said layer of oxide material; and
    a pair of bridge regions located in said layer of conductivity type 1 silicon and in electrical contact with said diffused source said and diffused drain guaranteeing electrical contact with an inversion region located under said layer of oxide material covered by said polysilicon gate.

2. The self-aligned transistor of claim 1, wherein said polysilicon gate of said layer of doped polysilicon is located intermediate said polysilicon source and said polysilicon drain of said layer of doped polysilicon and on one side of said layer of oxide material.

3. The self-aligned transistor of claim 2, wherein said polysilicon gate is physically spaced from each of said polysilicon source and said polysilicon drain located in said polysilicon layer.

4. The self-aligned transistor of claim 1, wherein said insulator material is composed of glass.

5. The self-aligned transistor of claim 4, wherein said glass is of a type incapable of withstanding sustained processing temperatures greater than about 200° C.

6. The self-aligned transistor of claim 1, wherein said layer of doped polysilicon is doped with materials selected from the group consisting of boron, phosphorous, and arsenic.

7. The self-aligned transistor of claim 1, additionally including a layer of dielectric material located intermediate and in contact with each of the subsrate and the layer doped polysilicon.

8. The self-aligned transistor of claim 7, wherein the layer of dielectric material is selected from the group consisting of silicon dioxide, silicon nitride, silicon oxynitride, and amorphous or sputter silicon.

9. The self-aligned transistor of claim 1, wherein one of said diffused source and said diffused drain is doped with boron when said layer of conductivity type 1 silicon is n-type, and either phosphorous or arsenic when said layer of conductivity type 1 silicon is p-type.

10. The self-aligned transistor of claim 1, wherein said pair of bridge regions are located in said layer of conductive type 1 silicon and have junction depths greater than about 500 Å.

11. A self-aligned transistor, comprising:
    a substrate;
    a layer of dielectric material;
    a layer of doped polysilicon bonded to said substrate via said layer of dielectric material;
    said layer of doped polysilicon being provided with spaces to define therein at least one source, at least one gate, and at least one drain;
    a layer of conductivity type 1 silicon;
    an oxide layer intermediate and in contact with the layer of polysilicon and the layer of conductivity type 1 silicon;
    said oxide layer having openings therein filled with polysilicon in contact with said doped polysilicon source and drain;
    at least one source and at least one drain diffused in said layer of conductivity type 1 silicon;
    said polysilicon source and said polysilicon drain being in electrical contact with said diffused source and diffused drain via said polysilicon filled holes in said oxide layer; and
    bridges located in said layer of conductivity type 1 silicon and in contact with said diffused source and diffused drain for providing electrical contact with an inversion region under said oxide layer covered by said gate of said layer of doped polysilicon.

12. The self-aligned transistor of claim 11, wherein said at least one gate of said layer of doped polysilicon is located intermediate said at least one source section and said at least one drain of said layer of doped polysilicon and all on one side of said oxide layers.

13. The self-aligned transistor of claim 11, wherein said substrate is selected from the group consisting of glass and polymer.

14. The self-aligned transistor of claim 11, wherein said substrate is composed of a material incapable of withstanding sustained processing temperatures greater than about 200° C.

15. The self-aligned transistor of claim 11, wherein said layer of doped polysilicon is doped with materials selected from the group consisting of boron, phosphorous, and arsenic.

16. The self-aligned transistor of claim 11, wherein one of said diffused source and said diffused drain is doped with boron when said layer of conductivity type 1 silicon is n-type, and either phosphorous or arsenic when said layer of conductivity type 1 silicon is p-type.

17. The self-aligned transistor of claim 11, wherein said layer of doped polysilicon is doped with an n-type dopant, and wherein one of said diffused source and diffused drain is doped with boron.

18. The self-aligned transistor of claim 16, wherein said layer of doped polysilicon is doped with a p-type dopant, and said diffused source and diffused drain are doped with phosphorous or arsenic.

19. The self-aligned transistor of claim 11, wherein the layer of dielectric material is selected from the group consisting of silicon dioxide, silicon nitride, silicon oxynitride, an amorphous or sputter silicon.

20. The self-aligned transistor of claim 11, wherein said oxide layer is composed of silicon dioxide.

21. A silicon on insulator self-aligned transistor, comprising:

a substrate, a dielectric layer on a surface of said substrate, a layer of polysilicon bonded to said substrate via said dielectric layer, an oxide layer intermediate said layer of polysilicon and a conductivity type 1 silicon layer, a source and a drain diffused in said conductivity type 1 silicon layer, said oxide layer having holes filled with polysilicon, said layer of polysilicon having spaces defining a polysilicon source, a polysilicon gate, and a polysilicon drain, said polysilicon source and drain being in electrical contact with said diffused source and drain via said polysilicon filled holes in said oxide layer, and bridges located in said conductivity type 1 silicon layer and in electrical contact with said diffused source and drain guaranteeing electrical contact with an inversion region located under said oxide layer covered by said polysilicon gate.

* * * * *